(12) United States Patent
Jung et al.

(10) Patent No.: US 10,790,368 B2
(45) Date of Patent: Sep. 29, 2020

(54) VERTICAL FET DEVICES INCLUDING A CONTACT ON PROTRUDING PORTIONS OF A SUBSTRATE

(71) Applicant: Samsung Electronics Co., Ltd., Suwon-si, Gyeonggi-do (KR)

(72) Inventors: Young Chai Jung, Anyang-si (KR); Myung Gil Kang, Suwon-si (KR); Kang Ill Seo, Eumseong-gun (KR); Seon Bae Kim, Hwaseong-si (KR); Yong Hee Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/275,675

(22) Filed: Feb. 14, 2019

(65) Prior Publication Data

US 2019/0355822 A1    Nov. 21, 2019

Related U.S. Application Data

(60) Provisional application No. 62/672,281, filed on May 16, 2018.

(51) Int. Cl.
| | |
|---|---|
| *H01L 29/417* | (2006.01) |
| *H01L 29/78* | (2006.01) |
| *H01L 29/45* | (2006.01) |
| *H01L 29/66* | (2006.01) |
| *H01L 23/522* | (2006.01) |

(52) U.S. Cl.
CPC .... *H01L 29/41741* (2013.01); *H01L 23/5226* (2013.01); *H01L 29/45* (2013.01); *H01L 29/66666* (2013.01); *H01L 29/7827* (2013.01)

(58) Field of Classification Search
None
See application file for complete search history.

(56) References Cited

U.S. PATENT DOCUMENTS

| | | |
|---|---|---|
| 7,442,619 B2 | 10/2008 | Luo et al. |
| 7,741,191 B2 | 6/2010 | Frohberg et al. |
| 7,880,306 B2 | 2/2011 | Satou |
| 8,324,058 B2 | 12/2012 | Cheng et al. |
| 8,507,349 B2 | 8/2013 | Lee |
| 9,805,935 B2 | 10/2017 | Anderson et al. |
| 9,853,127 B1 | 12/2017 | Anderson et al. |
| 2011/0233661 A1 | 9/2011 | Kajiyama |
| 2017/0077304 A1 | 3/2017 | Obradovic et al. |
| 2017/0194155 A1* | 7/2017 | Anderson ......... H01L 21/28518 |
| 2018/0005903 A1 | 1/2018 | Basker et al. |
| 2018/0053844 A1 | 2/2018 | Bi et al. |

FOREIGN PATENT DOCUMENTS

JP    2011-44625    3/2011

* cited by examiner

*Primary Examiner* — Robert K Carpenter
(74) *Attorney, Agent, or Firm* — Myers Bigel, P.A.

(57) ABSTRACT

VFET devices are provided. A VFET device includes a substrate including first and second protruding portions. The VFET device includes an isolation region between the first and second protruding portions. The VFET device includes first and second silicide regions on the first and second protruding portions, respectively. Moreover, the VFET device includes a contact on the first and second silicide regions. Related methods of forming a VFET device are also provided.

20 Claims, 5 Drawing Sheets

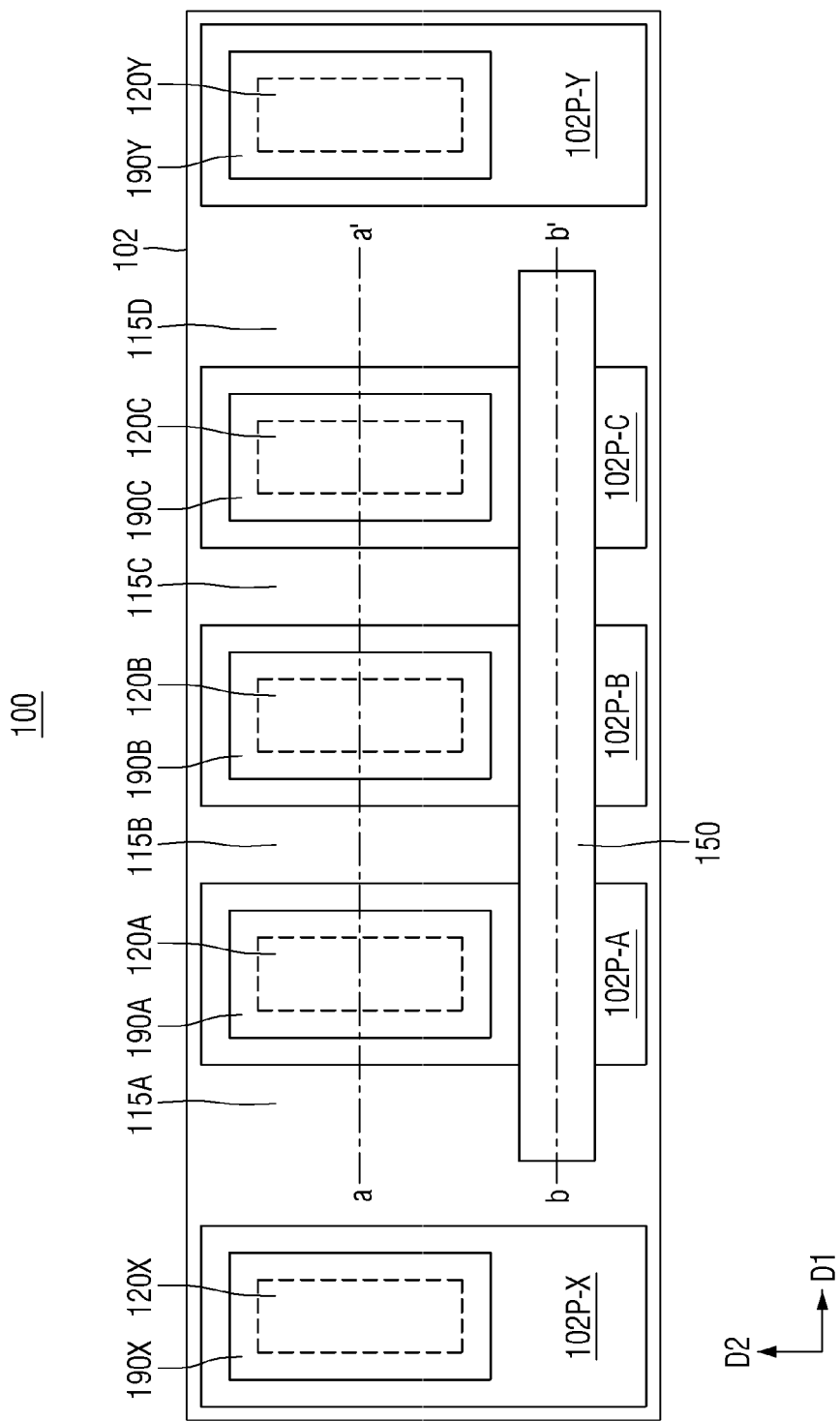

VERTICAL FET DEVICES INCLUDING A CONTACT ON PROTRUDING PORTIONS OF A SUBSTRATE

CLAIM OF PRIORITY

The present application claims the benefit of U.S. Provisional Patent Application Ser. No. 62/672,281, filed on May 16, 2018, entitled Vertical FET Structure to Reduce Bottom Contact Resistance and Methods of Fabricating the Same, the disclosure of which is hereby incorporated herein in its entirety by reference.

FIELD

The present disclosure generally relates to the field of semiconductor devices and, more particularly, to vertical field-effect transistor (VFET) devices.

BACKGROUND

VFETs have been studied as candidates for next-generation device structures beyond fin-shaped FETs (FinFETs) because VFET structures can provide scalability and middle-of-line (MOL) capacitance reduction. VFETs may present challenges, however, with respect to channel stress engineering, gate length control, and/or junction formation. For example, the structure of a VFET may make it difficult to apply strain on the channel of the VFET.

SUMMARY

A VFET device, according to some embodiments herein, may include a substrate including a plurality of vertically protruding portions. The VFET device may include a plurality of isolation regions in an alternating arrangement between the plurality of vertically protruding portions. The VFET device may include a plurality of silicide regions on top surfaces and sidewalls of the plurality of vertically protruding portions. Moreover, the VFET device may include a contact on the plurality of silicide regions on the top surfaces and the sidewalls of the plurality of vertically protruding portions.

In some embodiments, the contact may include a plurality of portions protruding toward the plurality of isolation regions, respectively. Sidewalls of the plurality of portions of the contact may physically contact the plurality of silicide regions. Additionally or alternatively, the contact may continuously extend across at least three of the plurality of vertically protruding portions and at least two of the plurality of isolation regions, and the sidewalls of the plurality of vertically protruding portions may include at least four sidewalls that face the contact.

According to some embodiments, the VFET device may include a plurality of fin-shaped semiconductor structures that vertically protrude from the plurality of vertically protruding portions, respectively. Moreover, the VFET device may include a plurality of upper source/drain regions on top surfaces of the plurality of fin-shaped semiconductor structures, respectively. The contact may be laterally spaced apart from the plurality of fin-shaped semiconductor structures and the plurality of upper source/drain regions. In some embodiments, the VFET device may include a plurality of lower source/drain regions between the plurality of fin-shaped semiconductor structures and the plurality of vertically protruding portions.

In some embodiments, the plurality of vertically protruding portions may include a first plurality of vertically protruding portions of the substrate. The VFET device may also include a second plurality of vertically protruding portions of the substrate. The second plurality of vertically protruding portions may be free of the contact thereon.

A VFET device, according to some embodiments herein, may include a substrate including first, second, and third vertically protruding portions. The VFET device may include a first isolation region between the first and second vertically protruding portions. The VFET device may include a second isolation region between the second and third vertically protruding portions. Moreover, the VFET device may include a contact on respective top surfaces and respective sidewalls of the first, second, and third vertically protruding portions.

In some embodiments, the VFET device may include silicide regions on the top surfaces and the sidewalls of the first, second, and third vertically protruding portions. The silicide regions may be between the contact and the first, second, and third vertically protruding portions. Moreover, the contact may include portions that physically contact portions of the silicide regions that are on the sidewalls of the first, second, and third vertically protruding portions.

According to some embodiments, the first and second isolation regions may be between lower portions of the first, second, and third vertically protruding portions. The portions of the contact may include first and second portions that protrude toward the first and second isolation regions, respectively. The first portion of the contact may be between an upper portion of the first vertically protruding portion and an upper portion of the second vertically protruding portion. Moreover, the second portion of the contact may be between the upper portion of the second vertically protruding portion and an upper portion of the third vertically protruding portion.

In some embodiments, the contact may extend continuously from the top surface of the first vertically protruding portion to the top surface of the second vertically protruding portion and to the top surface of the third vertically protruding portion.

According to some embodiments, the VFET device may include first, second, and third fin-shaped semiconductor structures on the first, second, and third vertically protruding portions, respectively. The VFET device may include first, second, and third upper source/drain regions on top surfaces of the first, second, and third fin-shaped semiconductor structures, respectively. The VFET device may include first, second, and third lower source/drain regions between the first, second, and third fin-shaped semiconductor structures and the first, second, and third vertically protruding portions. The first, second, and third fin-shaped semiconductor structures may be the only fin-shaped semiconductor structures on the first, second, and third vertically protruding portions, respectively. Moreover, the contact may be laterally spaced apart from the first, second, and third fin-shaped semiconductor structures.

In some embodiments, the substrate may include fourth and fifth vertically protruding portions, and the VFET device may include a third isolation region between the fourth and first vertically protruding portions. Moreover, the VFET device may include a fourth isolation region between the fifth and third vertically protruding portions, and the fourth and fifth vertically protruding portions may be free of the contact thereon.

A VFET device, according to some embodiments herein, may include a substrate including first and second protruding portions. The VFET device may include an isolation region between the first and second protruding portions. The VFET device may include first and second silicide regions on the first and second protruding portions, respectively. Moreover, the VFET device may include a contact extending continuously from a top portion of the first silicide region that is on a top surface of the first protruding portion to a top portion of the second silicide region that is on a top surface of the second protruding portion. The contact may include a portion that protrudes between the first and second protruding portions toward the isolation region.

In some embodiments, the VFET device may include a third protruding portion of the substrate, and a third silicide region on the third protruding portion. The isolation region may include a first isolation region. Moreover, the VFET device may include a second isolation region between the second and third protruding portions. The contact may extend continuously from the top portion of the second silicide region to a top portion of the third silicide region that is on a top surface of the third protruding portion.

According to some embodiments, the portion of the contact that protrudes may be a first portion, and the contact may include a second portion that protrudes between the second and third protruding portions toward the second isolation region.

In some embodiments, the portion of the contact that protrudes may physically contact a sidewall portion of the first silicide region that is on a sidewall of the first protruding portion and a sidewall portion of the second silicide region that is on a sidewall of the second protruding portion. Moreover, the isolation region may be between a lower portion of the sidewall of the first protruding portion and a lower portion of the sidewall of the second protruding portion. The portion of the contact that protrudes may be between an upper portion of the sidewall of the first protruding portion and an upper portion of the sidewall of the second protruding portion.

According to some embodiments, the VFET device may include a third protruding portion of the substrate. The isolation region may be a first isolation region. Moreover, the VFET device may include a second isolation region adjacent and between the first and third protruding portions, and the third protruding portion may be free of the contact thereon.

A method of forming a VFET device, according to some embodiments herein, may include forming a plurality of silicide regions on top surfaces and sidewalls of a plurality of protruding portions of a substrate. The method may include forming a contact on top portions of the plurality of silicide regions that are on the top surfaces of the plurality of protruding portions, and on sidewall portions of the plurality of silicide regions that are on the sidewalls of the plurality of protruding portions. Moreover, the contact may be laterally spaced apart from a plurality of fin-shaped semiconductor structures that is on the plurality of protruding portions, respectively.

In some embodiments, the method may include forming the plurality of protruding portions by patterning the substrate. Moreover, the method may include forming isolation regions between the plurality of protruding portions, before forming the plurality of silicide regions.

According to some embodiments, forming the isolation regions may include forming an isolation material between the plurality of protruding portions, and removing upper portions of the isolation material from upper portions of the sidewalls of the plurality of protruding portions. In some embodiments, forming the plurality of silicide regions may include forming the plurality of silicide regions on the upper portions of the sidewalls of the plurality of protruding portions. Moreover, forming the contact may include forming the contact to continuously extend across first, second, and third ones of the plurality of protruding portions.

In some embodiments, the method may include forming a plurality of lower source/drain regions and the plurality of fin-shaped semiconductor structures on the substrate. The plurality of fin-shaped semiconductor structures may be on the plurality of lower source/drain regions, respectively. The method may include forming the plurality of silicide regions on exposed portions of the lower source/drain regions. Moreover, the method may include forming a plurality of upper source/drain regions on the plurality of fin-shaped semiconductor structures, respectively. The contact may be laterally spaced apart from the plurality of upper source/drain regions.

According to some embodiments, the plurality of protruding portions may include a first plurality of protruding portions, and the substrate may include a second plurality of protruding portions. Moreover, forming the contact may include forming the contact on the first plurality of protruding portions, while refraining from forming the contact on the second plurality of protruding portions.

BRIEF DESCRIPTION OF THE DRAWINGS

FIG. 1A is a plan view of a VFET device according to embodiments of the present inventive concepts.

DETAILED DESCRIPTION

Figure 1B:
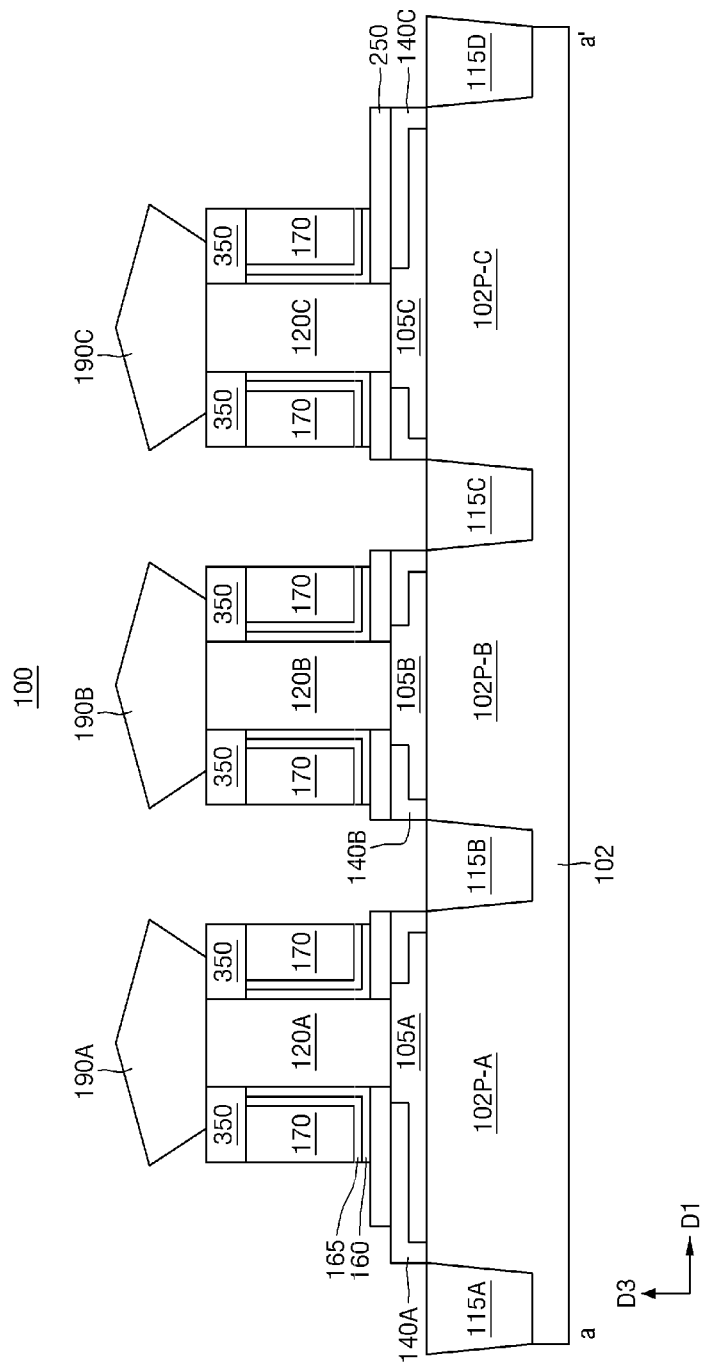
FIG. 1B is a cross-sectional view taken along line a-a' of FIG. 1A.

Pursuant to embodiments of the present inventive concepts, VFET devices are provided. Due to the structure of a VFET device, it may be difficult to strain the channel of the VFET device. Accordingly, it may be beneficial to improve performance of the VFET device by improving a contact of the VFET device. For example, according to embodiments of the present inventive concepts, by increasing the surface area of an interface between a contact of a VFET device and silicide regions of the VFET device, contact resistance of the VFET device may be reduced, thus improving performance of the VFET device.

Example embodiments of the present inventive concepts will be described in greater detail with reference to the attached figures.

FIG. 1A is a plan view of a VFET device 100 according to embodiments of the present inventive concepts. The VFET device 100 may include substrate 102, such as a semiconductor substrate or another type of substrate. The substrate 102 may include a plurality of vertically protruding portions 102P-A, 102P-B, 102P-C, 102P-X and 102P-Y. Moreover, a plurality of isolation regions 115A, 115B, 115C and 115D may be in an alternating arrangement between the vertically protruding portions 102P-A, 102P-B, 102P-C, 102P-X and 102P-Y. For example, each pair of adjacent ones of the vertically protruding portions 102P-A, 102P-B, 102P-C, 102P-X and 102P-Y may have one of the isolation regions 115A, 115B, 115C and 115D therebetween in a first direction D1. Accordingly, the vertically protruding portions 102P-A, 102P-B, 102P-C, 102P-X and 102P-Y may alternate with the isolation regions 115A, 115B, 115C and 115D along the first direction D1.

As an example, the isolation regions 115A, 115B, 115C and 115D may comprise: (a) an isolation region 115A that is between a vertically protruding portion 102P-X and a vertically protruding portion 102P-A, (b) an isolation region 115B that is between the vertically protruding portion 102P-A and a vertically protruding portion 102P-B, (c) an isolation region 115C that is between the vertically protruding portion 102P-B and a vertically protruding portion 102P-C, and (d) an isolation region 115D that is between the vertically protruding portion 102P-C and a vertically protruding portion 102P-Y.

The VFET device 100 may include a contact 150, such as a conductive (e.g., metal) contact, that is on one or more of the vertically protruding portions 102P-A, 102P-B, 102P-C, 102P-X and 102P-Y. For example, FIG. 1A shows that the contact 150 is on the three vertically protruding portions 102P-A, 102P-B, and 102P-C, and is absent from the two vertically protruding portions 102P-X and 102P-Y. Accordingly, the two vertically protruding portions 102P-X and 102P-Y are free of the contact 150 thereon. Specifically, the two vertically protruding portions 102P-X and 102P-Y are not overlapped in a vertical third direction D3 (FIG. 1C) by the contact 150. In some embodiments, however, the contact 150 may be on one, two, four, or more of the vertically protruding portions 102P-A, 102P-B, 102P-C, 102P-X and 102P-Y, and absent from none, one, three, four, or more of the vertically protruding portions 102P-A, 102P-B, 102P-C, 102P-X and 102P-Y.

Moreover, the VFET device 100 may include a plurality of fin-shaped semiconductor structures 120A, 120B, 120C, 120X and 120Y that vertically protrude from the vertically protruding portions 102P-A, 102P-B, 102P-C, 102P-X and 102P-Y, respectively. The VFET device 100 may also include a plurality of upper source/drain regions 190A, 190B, 190C, 190X and 190Y on top surfaces of the fin-shaped semiconductor structures 120A, 120B, 120C, 120X and 120Y, respectively. For example, the upper source/drain regions 190A, 190B, 190C, 190X and 190Y may be unmerged upper source/drain regions 190X, 190A, 190B, 190C, and 190Y that are on top surfaces of fin-shaped semiconductor structures 120X, 120A, 120B, 120C, and 120Y, respectively. Accordingly, the upper source/drain regions 190A, 190B, 190C, 190X and 190Y may be laterally spaced apart from each other in the first direction D1. Also, the contact 150 may be laterally spaced apart from the fin-shaped semiconductor structures 120A, 120B, 120C, 120X and 120Y and the upper source/drain regions 190A, 190B, 190C, 190X and 190Y in a second direction D2, which may be perpendicular to the first direction D1.

FIG. 1B is a cross-sectional view taken along line a-a' of FIG. 1A. As shown in FIG. 1B, the VFET device 100 may include a plurality of lower source/drain regions 105A, 105B and 105C between the fin-shaped semiconductor structures 120A, 120B and 120C and the vertically protruding portions 102P-A, 102P-B and 102P-C. For example, a lower source/drain region 105A is between, in a vertical third direction D3, the fin-shaped semiconductor structure 120A and the vertically protruding portion 102P-A. The third direction D3 may be perpendicular to the first direction D1 and/or to the second direction D2 (FIG. 1A). Similarly, a lower source/drain region 105B is between the fin-shaped semiconductor structure 120B and the vertically protruding portion 102P-B, and a lower source/drain region 105C is between the fin-shaped semiconductor structure 120C and the vertically protruding portion 102P-C.

The lower source/drain regions 105A, 105B and 105C may be doped semiconductor regions. For example, the lower source/drain regions 105A, 105B and 105C may, in some embodiments, be implanted regions of the vertically protruding portions 102P-A, 102P-B and 102P-C of the substrate 102. Alternatively, the lower source/drain regions 105A, 105B and 105C may be epitaxially grown on the vertically protruding portions 102P-A, 102P-B and 102P-C of the substrate 102.

As shown in FIG. 1B, the vertically protruding portions 102P-A, 102P-B and 102P-C protrude from the substrate 102 in the third direction D3, and the fin-shaped semiconductor structures 120A, 120B and 120C protrude from the vertically protruding portions 102P-A, 102P-B and 102P-C in the third direction D3. By providing a pair of the isolation regions 115A, 115B, 115C and 115D on opposite (e.g., right and left) sides of each protruding portion 102P-A, 102P-B and 102P-C having a fin-shaped semiconductor structure 120A, 120B and 120C thereon, isolation between adjacent ones of the fin-shaped semiconductor structures 120A, 120B and 120C may be improved.

FIG. 1B also illustrates that the VFET device 100 may include a plurality of silicide regions 140A, 140B, and 140C on the vertically protruding portions 102P-A, 102P-B and 102P-C. For example, the plurality of silicide regions 140A, 140B, and 140C may comprise: (a) a silicide region 140A on the vertically protruding portion 102P-A, (b) a silicide region 140B on the vertically protruding portion 102P-B, and (c) a silicide region 140C on the vertically protruding portion 102P-C. In some embodiments, the silicide regions 140A, 140B, and 140C may be on the lower source/drain regions 105A, 105B and 105C.

The VFET device 100 may also include gate electrodes 170 that may be on sidewalls of the fin-shaped semiconductor structures 120A, 120B and 120C. The gate electrodes 170 may be unmerged gate electrodes, as the respective gate electrodes 170 that are on the fin-shaped semiconductor structures 120A and 120C may be spaced apart from the gate electrode 170 that is on the fin-shaped semiconductor structure 120B.

One or more insulation regions may be between the lower source/drain regions 105A, 105B and 105C and the gate electrodes 170. For example, an insulator 160, and/or an insulator 250, may be between the lower source/drain regions 105A, 105B and 105C and the gate electrodes 170. In some embodiments, the insulator 160 may be a high-k gate dielectric layer. Moreover, a work-function metal layer 165 may be between the insulator 160 and the gate electrodes 170, and an insulator 350, which may be a spacer dielectric layer, may be on top of the gate electrodes 170. Additionally or alternatively, the VFET device 100 may include one or more insulation regions between the gate electrodes 170 and/or between the upper source/drain regions 190A, 190B and 190C.

Figure 1C:
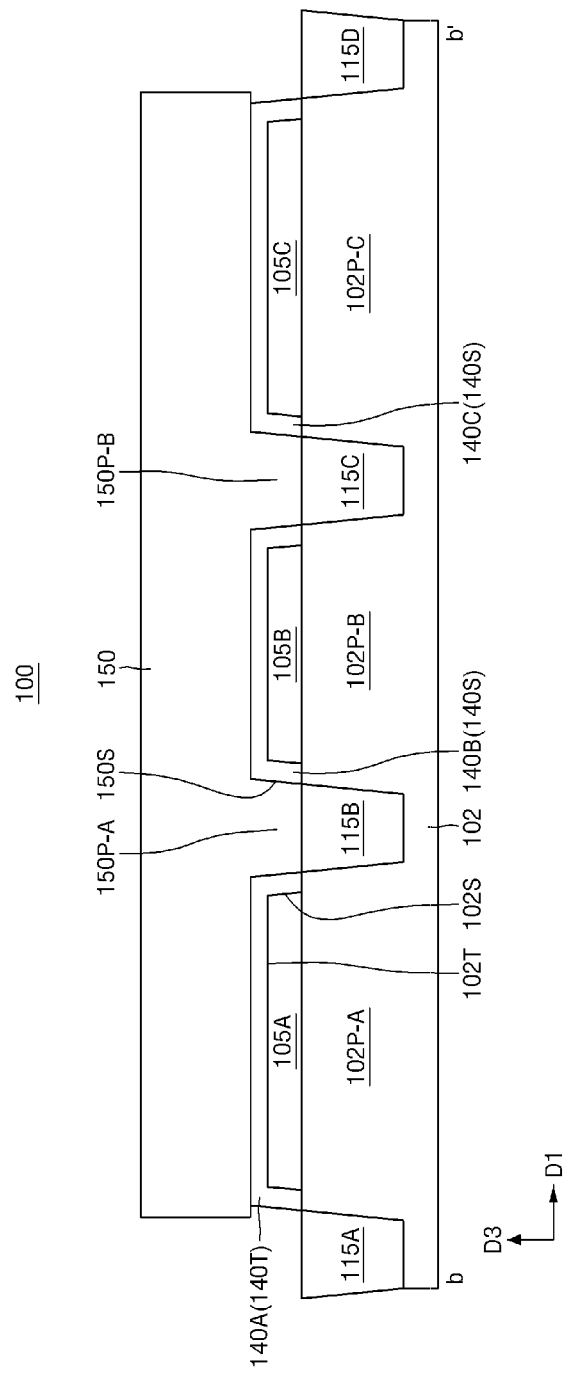
FIG. 1C is a cross-sectional view taken along line b-b' of FIG. 1A.

FIG. 1C is a cross-sectional view taken along line b-b' of FIG. 1A. As shown in FIG. 1C, the silicide regions 140A, 140B and 140C may be on top surfaces 102T and sidewalls 102S of the vertically protruding portions 102P-A, 102P-B and 102P-C of the substrate 102. For example, the silicide region 140A may be on a top surface 102T of the vertically protruding portion 102P-A, the silicide region 140B may be on a top surface 102T of the vertically protruding portion 102P-B, and the silicide region 140C may be on a top surface 102T of the vertically protruding portion 102P-C. Moreover, the silicide region 140A may be on at least one sidewall 102S of the vertically protruding portion 102P-A, the silicide region 140B may be on at least one sidewall 102S of the vertically protruding portion 102P-B, and the silicide region 140C may be on at least one sidewall 102S of the vertically protruding portion 102P-C. For example, each silicide region 140 may extend in the second direction D2 (FIG. 1A) on opposite sidewalls 102S, and on the top surface 102T, of its respective protruding portion 102P from the contact 150 to the region of the protruding portion 102P that has the fin-shaped semiconductor structure 120 thereon. In some embodiments, the top surfaces 102T and the sidewalls 102S may be top surfaces and sidewalls of the lower source/drain regions 105.

The contact 150, which may be used to apply a voltage to the lower source/drain regions 105, may be on the silicide regions 140A, 140B and 140C on at least one of the top surfaces 102T and at least one of the sidewalls 102S of the vertically protruding portions 102P-A, 102P-B and 102P-C. For example, the contact 150 may include a plurality of portions 150P-A and 150P-B protruding toward respective ones of the isolation regions 115A, 115B, 115C, 115D. In some embodiments, sidewalls 150S of the portions 150P-A and 150P-B of the contact 150 may physically (i.e., directly) contact the silicide regions 140A, 140B and 140C. As an example, the sidewalls 150S of the portions 150P-A and 150P-B may physically contact portions 140S of the silicide regions 140A, 140B and 140C that are on the sidewalls 102S of the vertically protruding portions 102P-A, 102P-B and 102P-C.

In some embodiments, each silicide region 140A, 140B and 140C may extend in the second direction D2 (FIG. 1A) on opposite sidewalls 102S of its respective protruding portion 102P from an interface with the contact 150 to the region of the protruding portion 102P that has the fin-shaped semiconductor structure 120A, 120B and 120C (FIG. 1B) thereon. This may increase the size (e.g., volume) of the silicide regions 140A, 140B and 140C extending between the contact 150 and the fin-shaped semiconductor structures 120A, 120B and 120C (FIG. 1B), and thus may improve the electrical connection between the contact 150 and the fin-shaped semiconductor structures 120A, 120B and 120C (FIG. 1B).

FIG. 1C shows an example in which the contact 150 continuously (i.e., without any disconnection) extends across top surfaces 102T of three of the vertically protruding portions 102P-A, 102P-B and 102P-C and across two of the isolation regions 115A, 115B, 115C and 115D. In some embodiments, however, the contact 150 may continuously extend across two of the vertically protruding portions 102P-A, 102P-B and 102P-C and one of the isolation regions 115A, 115B, 115C and 115D. For example, the contact 150 may extend continuously from a top portion 140T of the silicide region 140A that is on the top surface 102T of the vertically protruding portion 102P-A to a top portion 140T of the silicide region 140B that is on the top surface 102T of the vertically second protruding portion 102P-B. Moreover, in some embodiments, the contact 150 may continuously extend across four or more of the vertically protruding portions 102P-A, 102P-B, 102P-C, 102P-X and 102P-Y (FIG. 1A) and three or more of the isolation regions 115A, 115B, 115C and 115D. Accordingly, the contact 150 may continuously extend, in the first direction D1, across at least two (or at least three or at least four) of the vertically protruding portions 102P-A, 102P-B, 102P-C, 102P-X, and 102P-Y (FIG. 1A) and at least one (or at least two or at least three) of the isolation regions 115A, 115B, 115C and 115D.

As shown in FIG. 1C, the two isolation regions 115B and 115C may be between lower portions of the three vertically protruding portions 102P-A, 102P-B, and 102P-C, and the two portions 150P-A and 150P-B of the contact 150 may protrude toward the two isolation regions 115B and 115C, respectively. In particular, the first portion 150P-A of the contact 150 may be between an upper portion (e.g., of a sidewall 102S) of the vertically protruding portion 102P-A and an upper portion (e.g., of a first sidewall 102S) of the vertically protruding portion 102P-B, and the portion 150P-B of the contact 150 may be between an upper portion (e.g., of a second sidewall 102S) of the vertically protruding portion 102P-B and an upper portion (e.g., of a sidewall 102S) of the vertically protruding portion 102P-C. Accordingly, in embodiments in which the contact 150 includes at least two protruding portions 150P-A and 150P-B, the contact 150 may extend onto (and thus be faced by) at least four sidewalls 102S of the vertically protruding portions 102P-A, 102P-B, and 102P-C.

Because the contact 150 may include at least one protruding portion 150P that physically/electrically contacts at least one sidewall 140S of at least one silicide region 140A, 140B, and 140C, the surface area of the interface between the contact 150 and the silicide regions 140A, 140B, and 140C may be larger in the VFET device 100 than in a structure that lacks the protruding portion(s) 150P-A and 150P-B. This may reduce contact resistance, thus improving performance of the VFET device 100.

Figure 2A:
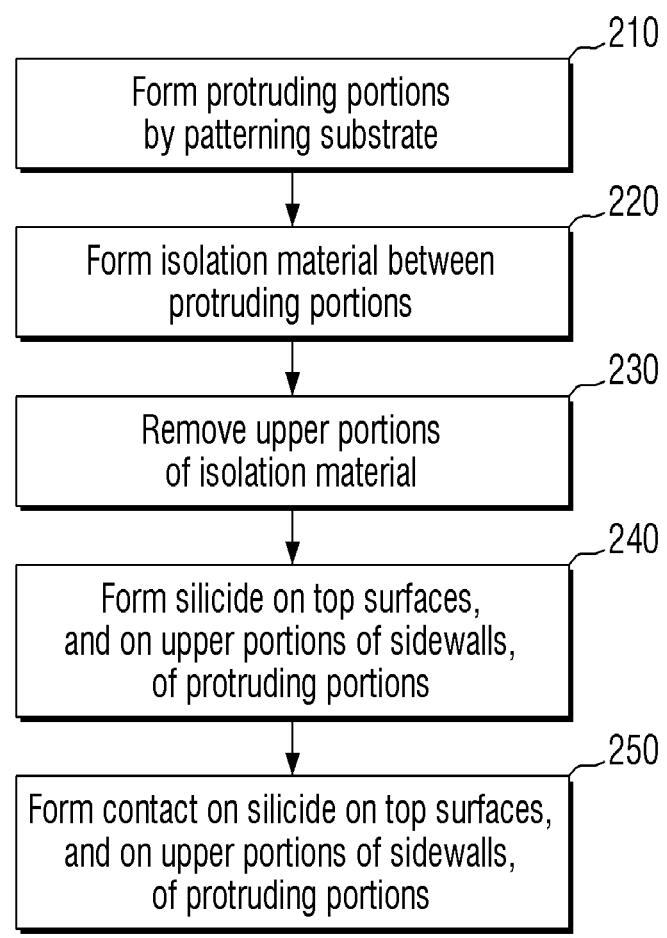
FIGS. 2A and 2B are flowcharts illustrating operations of forming a VFET device according to embodiments of the present inventive concepts.
Figure 2B:
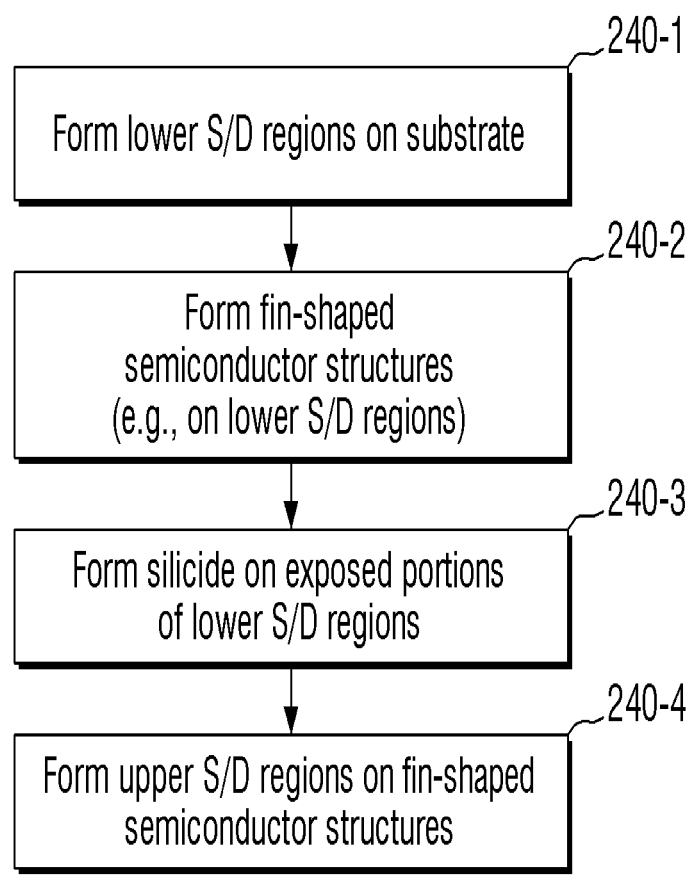

FIGS. 2A and 2B are flowcharts illustrating operations of forming a VFET device 100 according to embodiments of the present inventive concepts. Referring to FIG. 1C and FIG. 2A, the operations may include forming (Block 240) a plurality of silicide regions 140A, 140B, and 140C on top surfaces 102T and sidewalls 102S (e.g., upper portions thereof) of a plurality of protruding portions 102P-A, 102P-B and 102P-C of a substrate 102. Moreover, the operations may include forming (Block 250) a contact 150 on top portions 140T of the silicide regions 140A, 140B, and 140C that are on the top surfaces 102T of the protruding portions 102P, and on sidewall portions 140S of the silicide regions 140A, 140B, and 140C that are on the sidewalls 102S (e.g., upper portions thereof) of the protruding portions 102P-A, 102P-B and 102P-C.

For example, the contact 150 may be conformally formed on the silicide regions 140A, 140B, and 140C to continuously extend across at least three of the protruding portions 102P-A, 102P-B, 102P-C, 102P-X, and 102P-Y (FIG. 1A). Specifically, the contact 150 may be formed on a top surface 102T and at least one sidewall 102S of each protruding portion 102P-A, 102P-B and 102P-C of a first group of the protruding portions 102P-A, 102P-B and 102P-C, while refraining from forming the contact 150 on a second group of protruding portions 102P-X and 102P-Y. As a result, the VFET device 100 shown in FIG. 1C may be provided. Also, as shown in FIG. 1A, the contact 150 may be laterally spaced apart in the second direction D2 from a plurality of fin-shaped semiconductor structures 120A, 120B, 120C, 120X and 120Y that is on the protruding portions 102P-A, 102P-B, 102P-C, 102P-X, and 102P-Y, respectively.

FIG. 2A shows that the operations of forming the VFET device 100 may also include forming (Block 210) the protruding portions 102P-A, 102P-B and 102P-C (FIG. 1C) by patterning the substrate 102, and forming isolation regions 115A, 115B, 115C and 115D (FIG. 1C) between the protruding portions 102P-A, 102P-B and 102P-C, before forming (Block 240) the silicide regions 140A, 140B and 140C (FIG. 1C). The operation(s) of forming the isolation regions 115A, 115B, 115C and 115D may include forming (Block 220) an isolation material between the protruding portions 102P-A, 102P-B and 102P-C, and removing (Block 230) upper portions of the isolation material from upper portions (e.g., of the sidewalls 102S (FIG. 1C)) of the protruding portions 102P-A, 102P-B and 102P-C.

Referring to FIG. 1B and FIG. 2B, the operation(s) of forming (Block 240) the silicide regions 140A, 140B and 140C may include forming (Blocks 240-1 and 240-2) a plurality of lower source/drain regions 105A, 105B and 105C and a plurality of fin-shaped semiconductor structures 120A, 120B and 120C on the substrate 102. The fin-shaped semiconductor structures 120A, 120B and 120C may be on the lower source/drain regions 105A, 105B and 105C, respectively. For example, the lower source/drain regions 105A, 105B and 105C may be formed, and the fin-shaped semiconductor structures 120A, 120B and 120C may subsequently be formed on the lower source/drain regions 105A, 105B and 105C. Moreover, in some embodiments, the operation(s) of forming the lower source/drain regions 105A, 105B and 105C may be performed as part of the operation(s) of Block 210 before the operations of Blocks 220 and 230. As an example, the lower source/drain regions 105A, 105B and 105C may be epitaxially grown from the substrate 102 before forming the protruding portions 102P-A, 102P-B and 102P-C of the substrate 102. Alternatively, the lower source/drain regions 105A, 105B and 105C may be formed by implantation after forming the fin-shaped semiconductor structures 120A, 120B and 120C.

The operations of FIG. 2B may also include forming (Block 240-3) the silicide regions 140A, 140B and 140C (FIG. 1C) on upper portions (e.g., of the sidewalls 102S (FIG. 1C)) of the protruding portions 102P-A, 102P-B and 102P-C (FIG. 1C). For example, the silicide regions 140A, 140B and 140C may be formed on exposed portions of the lower source/drain regions 105A, 105B and 105C (FIG. 1C). Subsequently, the operations of FIG. 2B may include forming (Block 240-4) a plurality of upper source/drain regions 190A, 190B and 190C (FIG. 1B) on the fin-shaped semiconductor structures 120A, 120B and 120C (FIG. 1B), respectively. As shown in FIG. 1A, the contact 150 may be laterally spaced apart from the upper source/drain regions 190A, 190B, 190C, 190X and 190Y in the second direction D2.

Some of the elements of the VFET device 100 may be formed using element(s) and/or operation(s) discussed in U.S. Pat. No. 9,805,935 to Anderson et al., the disclosure of which is hereby incorporated herein by reference in its entirety. For example, the lower source/drain regions 105A, 105B, and 105C (FIG. 1B), the fin-shaped semiconductor structures 120A, 120B and 120C (FIG. 1B), and/or various insulators (e.g., interlayer dielectric layers) may be formed using element(s) and/or operation(s) discussed in U.S. Pat. No. 9,805,935 to Anderson et al.

The VFET device 100 according to embodiments of the present inventive concepts may provide a number of advantages. These advantages include reducing contact resistance by increasing the surface area of the interface between the contact 150 (FIG. 1C) and the silicide regions 140A, 140B, and 140C (FIG. 1C). For example, the contact 150 may include at least one protruding portion 150P-A/150P-B (FIG. 1C) that may protrude to physically/electrically contact at least one sidewall 140S (FIG. 1C) of at least one silicide region 140A, 140B and 140C (FIG. 1C), thus increasing the surface area of the interface between the contact 150 and the silicide regions 140A, 140B, and 140C. This may reduce contact resistance, thus improving performance of the VFET device 100.

Moreover, referring to FIG. 1C, by providing a pair of the isolation regions 115A, 115B, 115C and 115D on opposite sides of each protruding portion 102P-A, 102P-B and 102P-C of the substrate 102 having a fin-shaped semiconductor structure 120A, 120B and 120C (FIG. 1B) thereon, isolation between adjacent ones of the fin-shaped semiconductor structures 120A, 120B and 120C may be improved. In some embodiments, each silicide region 140A, 140B and 140C may extend in the second direction D2 on opposite sidewalls 102S of its respective protruding portion 102P-A, 102P-B and 102P-C from the contact 150 to the region of the protruding portion 102P-A, 102P-B and 102P-C that has a respective fin-shaped semiconductor structure 120A, 120B and 120C thereon. This may increase the size (e.g., volume) of the silicide region 140A, 140B and 140C between the contact 150 and the respective fin-shaped semiconductor structure 120A, 120B and 120C, and thus may improve the electrical connection between the contact 150 and that fin-shaped semiconductor structure 120A, 120B and 120C.

Example embodiments are described herein with reference to the accompanying drawings. Many different forms and embodiments are possible without deviating from the teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the present inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments of the present inventive concepts should not be construed as limited to the particular shapes illustrated herein but may include deviations in shapes that result, for example, from manufacturing.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concepts.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A vertical field-effect transistor (VFET) device comprising:
   a substrate comprising a plurality of vertically protruding portions;
   a plurality of isolation regions in an alternating arrangement between the plurality of vertically protruding portions;
   a plurality of silicide regions on top surfaces and sidewalls of the plurality of vertically protruding portions; and
   a contact on the plurality of silicide regions and continuously extending from a top portion of a first of the plurality of silicide regions that is on a first of the plurality of vertically protruding portions to a top portion of a second of the plurality of silicide regions that is on a second of the plurality of vertically protruding portions.

2. The VFET device of claim 1,
   wherein the contact comprises a plurality of portions protruding toward the plurality of isolation regions, respectively, and
   wherein the contact extends continuously between the plurality of portions of the contact.

3. The VFET device of claim 2, wherein sidewalls of the plurality of portions of the contact physically contact the plurality of silicide regions.

4. The VFET device of claim 1,
   wherein the contact continuously extends across at least three of the plurality of vertically protruding portions and at least two of the plurality of isolation regions, and
   wherein the sidewalls of the plurality of vertically protruding portions comprise at least four sidewalls that face the contact.

5. The VFET device of claim 1, further comprising:
   a plurality of fin-shaped semiconductor structures that vertically protrude from the plurality of vertically protruding portions, respectively; and
   a plurality of upper source/drain regions on top surfaces of the plurality of fin-shaped semiconductor structures, respectively,
   wherein the contact is laterally spaced apart from the plurality of fin-shaped semiconductor structures and the plurality of upper source/drain regions.

6. The VFET device of claim 5, further comprising a plurality of lower source/drain regions between the plurality of fin-shaped semiconductor structures and the plurality of vertically protruding portions.

7. The VFET device of claim 1,
   wherein the plurality of vertically protruding portions comprises a first plurality of vertically protruding portions of the substrate,
   wherein the VFET device further comprises a second plurality of vertically protruding portions of the substrate, and
   wherein the second plurality of vertically protruding portions is free of the contact thereon.

8. A vertical field-effect transistor (VFET) device comprising:
   a substrate comprising first, second, and third vertically protruding portions;
   a first isolation region between the first and second vertically protruding portions;
   a second isolation region between the second and third vertically protruding portions; and
   a contact on respective top surfaces and respective sidewalls of the first, second, and third vertically protruding portions, wherein the contact extends continuously from the top surface of the first vertically protruding portion to the top surface of the second vertically protruding portion and to the top surface of the third vertically protruding portion.

9. The VFET device of claim 8, further comprising silicide regions on the top surfaces and the sidewalls of the first, second, and third vertically protruding portions,
wherein the silicide regions are between the contact and the first, second, and third vertically protruding portions.

10. The VFET device of claim 9, wherein the contact comprises portions that physically contact portions of the silicide regions that are on the sidewalls of the first, second, and third vertically protruding portions.

11. The VFET device of claim 10,
wherein the first and second isolation regions are between lower portions of the first, second, and third vertically protruding portions,
wherein the portions of the contact comprise first and second portions that protrude toward the first and second isolation regions, respectively,
wherein the first portion of the contact is between an upper portion of the first vertically protruding portion and an upper portion of the second vertically protruding portion, and
wherein the second portion of the contact is between the upper portion of the second vertically protruding portion and an upper portion of the third vertically protruding portion.

12. The VFET device of claim 8, further comprising:
first, second, and third fin-shaped semiconductor structures on the first, second, and third vertically protruding portions, respectively;
first, second, and third upper source/drain regions on top surfaces of the first, second, and third fin-shaped semiconductor structures, respectively; and
first, second, and third lower source/drain regions between the first, second, and third fin-shaped semiconductor structures and the first, second, and third vertically protruding portions,
wherein the first, second, and third fin-shaped semiconductor structures comprise the only fin-shaped semiconductor structures on the first, second, and third vertically protruding portions, respectively, and
wherein the contact is laterally spaced apart from the first, second, and third fin-shaped semiconductor structures.

13. The VFET device of claim 8,
wherein the substrate further comprises fourth and fifth vertically protruding portions,
wherein the VFET device further comprises a third isolation region between the fourth and first vertically protruding portions,
wherein the VFET device further comprises a fourth isolation region between the fifth and third vertically protruding portions, and
wherein the fourth and fifth vertically protruding portions are free of the contact thereon.

14. The VFET device of claim 1, wherein the contact extends continuously from a sidewall of the first of the plurality of silicide regions to a sidewall of the second of the plurality of silicide regions.

15. A vertical field-effect transistor (VFET) device comprising:
a substrate comprising first and second protruding portions;
an isolation region between the first and second protruding portions;
first and second silicide regions on the first and second protruding portions, respectively; and
a contact extending continuously from a top portion of the first silicide region that is on a top surface of the first protruding portion to a top portion of the second silicide region that is on a top surface of the second protruding portion, wherein the contact comprises a portion that protrudes between the first and second protruding portions toward the isolation region.

16. The VFET device of claim 15, further comprising:
a third protruding portion of the substrate; and
a third silicide region on the third protruding portion,
wherein the isolation region comprises a first isolation region,
wherein the VFET device further comprises a second isolation region between the second and third protruding portions, and
wherein the contact extends continuously from the top portion of the second silicide region to a top portion of the third silicide region that is on a top surface of the third protruding portion.

17. The VFET device of claim 16,
wherein the portion of the contact that protrudes comprises a first portion, and
wherein the contact further comprises a second portion that protrudes between the second and third protruding portions toward the second isolation region.

18. The VFET device of claim 15, wherein the portion of the contact that protrudes physically contacts a sidewall portion of the first silicide region that is on a sidewall of the first protruding portion and a sidewall portion of the second silicide region that is on a sidewall of the second protruding portion.

19. The VFET device of claim 18,
wherein the isolation region is between a lower portion of the sidewall of the first protruding portion and a lower portion of the sidewall of the second protruding portion, and
wherein the portion of the contact that protrudes is between an upper portion of the sidewall of the first protruding portion and an upper portion of the sidewall of the second protruding portion.

20. The VFET device of claim 15, further comprising a third protruding portion of the substrate,
wherein the isolation region comprises a first isolation region,
wherein the VFET device further comprises a second isolation region adjacent and between the first and third protruding portions, and
wherein the third protruding portion is free of the contact thereon.

* * * * *